United States Patent [19]

Todokoro

[11] 4,008,442
[45] Feb. 15, 1977

[54] SIGNAL AMPLIFIER CIRCUIT WITH A FIELD EFFECT TRANSISTOR HAVING CURRENT UNSATURATED TRIODE VACUUM TUBE CHARACTERISTICS

[75] Inventor: Shigeru Todokoro, Fujisawa, Japan

[73] Assignee: Tokyo Shibaura Electric Co., Ltd., Kawasaki, Japan

[22] Filed: June 10, 1975

[21] Appl. No.: 585,595

[30] Foreign Application Priority Data

June 19, 1974 Japan ............... 49-70675[U]

[52] U.S. Cl. .................... 330/35; 330/17; 330/18; 330/22; 330/24; 330/40; 330/149

[51] Int. Cl.$^2$ .................. H03F 3/16; H03F 1/30

[58] Field of Search .......... 330/17, 18, 22, 35, 330/40, 70, 71, 149, 24

[56] References Cited

UNITED STATES PATENTS

| | | | |
|---|---|---|---|
| 3,286,189 | 11/1966 | Mitchell et al. | 330/18 |
| 3,369,186 | 2/1968 | Lejon | 330/10 |
| 3,389,344 | 6/1968 | Fichtner | 330/149 X |
| 3,516,003 | 6/1970 | Boone | 330/35 X |
| 3,828,230 | 8/1974 | Nishizawa et al. | 357/22 |

Primary Examiner—James B. Mullins
Attorney, Agent, or Firm—Oblon, Fisher, Spivak, McClelland & Maier

[57] ABSTRACT

A signal amplifier circuit using a field effect transistor having current unsaturated characteristics like a triode vacuum tube. The field effect transistor has drain and source electrodes coupled respectively through drain and source resistors to first and second different potential points between which a supply voltage may be applied. In the present invention the first potential point is coupled to the source electrode of the field effect transistor by an impedance means to render the signal amplifier circuit insensitive to variation in the supply voltage. The impedance means may be an active or passive element such as a bipolar transistor or resistor.

2 Claims, 5 Drawing Figures

SIGNAL AMPLIFIER CIRCUIT WITH A FIELD EFFECT TRANSISTOR HAVING CURRENT UNSATURATED TRIODE VACUUM TUBE CHARACTERISTICS

BACKGROUND OF THE INVENTION

This invention relates to a signal amplifier circuit and more particularly to a signal amplifier circuit using a field effect transistor having current unsaturated triode vacuum tube characteristics.

Recently, field effect transistor having current unsaturated characteristics like those of a triode vacuum tube disclosed in U.S. Pat. No. 3,828,230 issued to Nishizawa et al on Aug. 6, 1974 (the corresponding Japanese Patent Application was laid open on Mar. 30, 1973) has attracted attention as an active semiconductor amplifying element for an audio signal amplifier circuit.

A field effect transistor and bipolar transistor hitherto used as an active amplifying element have current saturated characteristics like those of a pentode vacuum tube. The aforesaid new field effect transistor excels over these conventional amplifying elements in respect of output power, linearity and frequency characteristics.

The fact that an amplifying element has triode vacuum tube characteristics means that the operating current of the amplifying element varies in response not only to an input signal voltage but also to variation in direct-current supply voltage. With a signal amplifier circuit using an amplifying element displaying triode vacuum tube characteristics, therefore, a varying component in the supply voltage, for example, a hum component is superposed on an output signal voltage. Further, where a direct-coupled signal amplifier circuit includes a field effect transistor having triode vacuum tube characteristics, then changes occur in the drain current of the field effect transistor due to an alternating-current signal being superposed on direct current supply voltage, failing to carry out a desired voltage amplification.

SUMMARY OF THE INVENTION

It is accordingly the object of this invention to provide a signal amplifier circuit using a field effect transistor displaying current unsaturated triode vacuum tube characteristics in which the operating current of the field effect transistor does not vary in response to variation in a power-supply voltage or an alternating current signal superposed on direct-current supply voltage, but only varies in response to an input signal voltage supplied to the gate electrode of the field effect transistor.

With the signal amplifier circuit of this invention, the first and second electrodes of a field effect transistor having current unsaturated triode vacuum tube characteristics are coupled to the first and second different potential points respectively through the corresponding first and second resistive impedance means. And the first potential point is coupled to the second electrode of the field effect transistor through a third impedance means.

In accordance with a first embodiment of this invention, the third impedance means consists of a resistive impedance. When the resistive impedance coupled between the second electrode of the field effect transistor and the first potential point has a value substantially equal to the resistance value of the second resistance impedance means multiplied by an amplification factor of the field effect transistor, the drain current thereof becomes substantially insensitive to variation in the voltage across the first and second potential points.

With a signal amplifier circuit according to a second embodiment of the invention, the third impedance means includes a bipolar transistor, the collector-to-emitter path of which is connected between the first potential point and the second electrode of the field effect transistor. The base of the bipolar transistor is coupled to a junction point of first and second biasing resistive impedance means coupled in series between the first and second potential points.

If, in the second embodiment, the first biasing resistive impedance means is chosen to have a value of resistance equal to the resistance value of the second biasing resistive impedance means multiplied by a voltage amplification factor of the field effect transistor, then the drain current thereof becomes substantially insensitive to variation in the voltage across the first and second different potential points.

DETAILED DESCRIPTION OF THE PREFERRED EMBODIMENTS

Figure 1:
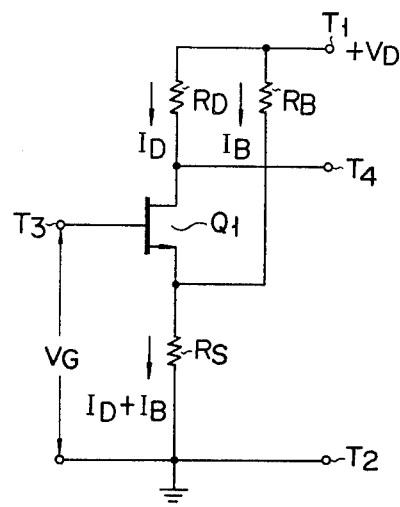
FIG. 1 is a schematic circuit diagram of a signal amplifier circuit according to a first embodiment of this invention.

With the first embodiment of this invention given in FIG. 1, the drain electrode of an n-channel type current unsaturated field effect transistor $Q_1$ is connected to a first potential point or power supply terminal $T_1$ ($+V_D$) through a first or drain resistor $R_D$. The source electrode of the transistor $Q_1$ is connected to a second potential point or power supply terminal $T_2$ (ground) through a second or source resistor $R_S$. The first power supply terminal $T_1$ is connected to the source electrode of transistor $Q_1$ through a third resistor $R_B$. The gate electrode of transisttor $Q_1$ is connected to an input terminal $T_3$ which is connected to a signal source or output of a preceding stage signal amplifier. The drain electrode of transistor $Q_1$ is connected to an output terminal $T_4$ from which an output signal developed across the drain resistor $R_D$ is taken. The output terminal $T_4$ may be coupled to an output of a succeeding stage amplifier.

The operating or drain current $I_D$ of a field effect transistor having current unsaturated triode vacuum tube characteristics may be approximately expressed by the following equation:

$$I_D = gm \left( V_{GS} + \frac{V_{ds}}{\mu} \right) \quad (1)$$

Since $\mu = gm \cdot r_p$ and $gm = r/\mu_p$, the above equation may be rewritten as follows:

$$I_D = \frac{1}{r_p} (\mu V_{GS} + V_{DS}) \quad (2)$$

where:
$\mu$ = voltage amplifying factor of field effect transistor
$gm$ = mutual conductance of field effect transistor
$r_p$ = internal resistance of field effect transistor
$V_{GS}$ = gate-to-source voltage of field effect transistor
$V_{DS}$ = drain-to-source voltage of field effect transistor Obviously, the drain current $I_D$ of the above-mentioned field effect transistor greatly varies with its drain-to-source voltage $V_{DS}$.

Referring to FIG. 1, with current flowing through the drain resistor $R_D$ designated as $I_D$ and current flowing through the resistor $R_B$ as $I_B$, the gate-to-source voltage $V_{GS}$ of the transistor $Q_1$ may be given as follows:

$$V_{GS} = V_G - R_S(I_D + I_B) \quad (3)$$

where:
$V_G$ denotes an input voltage supplied between the terminals $T_2$, $T_3$.

The drain-to-source voltage $V_{DS}$ may be indicated as follows:

$$V_{DS} = V_D - I_D - (I_D + I_B)R_S \quad (4)$$

Since $V_D = I_B \cdot R_B + R_S(I_D + I_B)$, there results the following equation:

$$I_B = \frac{V_D - I_D R_S}{R_B + R_S} \quad (5)$$

By substituting the above equations (3), (4), (5) into the above equation (2), the following equation is obtained:

$$I_D = \frac{\mu \cdot V_G + \frac{(R_B - \mu R_S)}{R_B + R_S} \cdot V_D}{r_p + R_D + (\mu + 1) \cdot \frac{R_B \cdot R_S}{R_B + R_S}} \quad (6)$$

The above equation (6) shows that when $R_B = [R_2$ within the range in which the above equations (2), (3), (4) are established, the operating or drain current $I_D$ of the abovementioned field effect transistor can become substantially independent of the supply voltage $V_D$. Namely, the drain current $I_D$ is substantially insensitive to variation in the power supply voltage $V_D$. This means that in the direct-coupled signal amplifier circuit, the transistor $Q_1$ is operated only in response to an input signal supplied to its gate, even when A.C. signal voltage is superposed on the D.C. voltage at the terminal $T_1$ and can retain its specific amplification, though a gain falls by an amount of feedback defined by a resultant parallel impedance of resistors $R_B$ and $R_S$. Therefore, the signal amplifier circuit of this invention offers great advantage in direct coupling to another signal amplifier circuit.

The relationship of $R_B = \mu R_S$ need not be rigid. By existence of the resistor $R_B$, voltage variation transmitted to the drain electrode of the aforesaid transistor $Q_1$ to increase its drain current is also fed to its source electrode to decrease the drain current and vice versa. In case of $R_B = \mu R_S$, increase and decrease in the drain current resulting from variation in the supply voltage are balanced. Resistors in the signal amplifier circuit of this invention need not be resistor elements, but may be replaced by other active or passive elements which have electrical resistivity.

Figure 2:
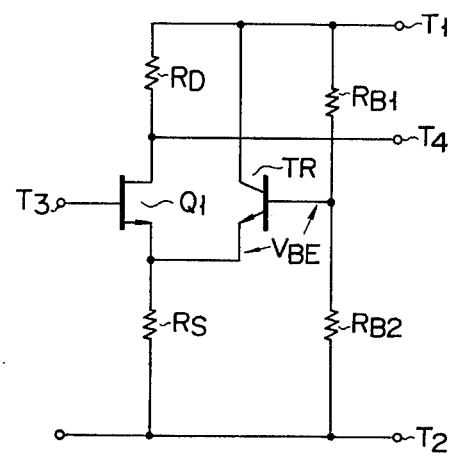
FIG. 2 is a schematic circuit diagram of a signal amplifier circuit according to a second embodiment of the invention.

FIG. 2 shows a signal amplifier circuit according to the second embodiment of this invention wherein the feedback resistor $R_B$ of FIG. 1 is replaced by a bipolar transistor. In FIG. 2, the collector electrode of an npn type transistor TR is connected to the first power supply terminal $T_1$ and the emitter electrode of transistor TR is connected to the source electrode of the field effect transistor $Q_1$. Resistors $R_{B1}$ and $R_{B2}$ are connected in series between the terminals $T_1$ and $T_2$, and the junction point of the resistors $R_{B1}$ and $R_{B2}$ is connected to the base electrode of transistor TR.

Referring to FIG. 2, the gate-to-source voltage $V_{GS}$ of the field effect transistor $Q_1$ may be given as follows:

$$V_{GS} = V_G - V_S \quad (7)$$

The drain-to-source voltage $V_{DS}$ of transistor $Q_1$ may be expressed as follows:

$$V_{DS} = V_D - I_D \cdot R_D - V_S \quad (8)$$

The source voltage $V_S$ of transistor $Q_1$ may be indicated as follows:

$$V_S = \frac{R_{B2}}{R_{B1} + R_{B2}} \cdot V_D - V_{BE} \quad (9)$$

where:
$V_{BE}$ denotes the base-to-emitter voltage of the bipolar transistor TR.

With the equations (7) to (9) substituted in the equation (2), the drain current $I_D$ of the field effect transistor $Q_1$ may be expressed as follows:

$$I_D = \frac{\mu \cdot V_G + (1 + \mu) \cdot V_{BE} + \left(1 - \frac{R_{B2}(1 + \mu)}{R_{B1} + R_{B2}}\right) V_D}{r_p + R_D} \quad (10)$$

The above equation (10) shows that in case of $$\frac{R_{B2}}{R_{B1} + R_{B2}} = \frac{1}{1 + \mu}$$

or $R_{B1} = \mu R_{B2}$, the operating or drain current $I_D$ of the field effect transistor $Q_1$ is not affected by the supply voltage $V_D$. The second embodiment of this invention shown in FIG. 2 can provide a larger gain than the first embodiment of FIG. 1, because the drain current $I_D$ of the field effect transistor $Q_1$ does not depend on the source resistor $R_S$ at all.

Figure 3:
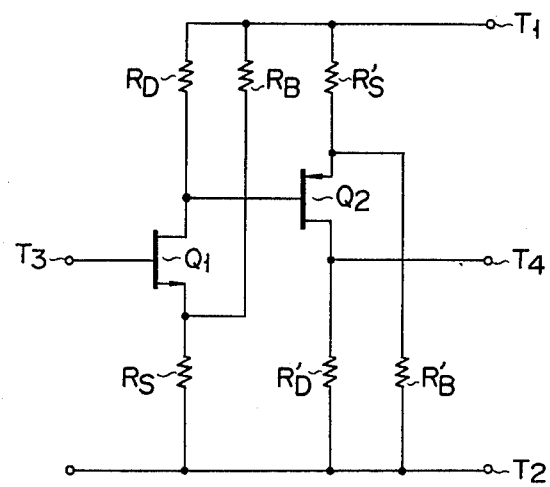
FIG. 3 is a schematic circuit diagram of a direct-coupled signal amplifier circuit according to a third embodiment of the invention.

The third embodiment of this invention shown in FIG. 3 represents a two-stage direct-coupled signal amplifier circuit. The preceding and succeeding stages are connected in parallel across the power source. The first stage amplifier is of the same type as shown in FIG.

1. The second stage amplifier includes a p-channel current unsaturated type field effect transistor $Q_2$ complementary to the transistor $Q_1$. The source electrode of the complementary transistor $Q_2$ is connected to the first power supply terminal $T_1$ through a second source resistor $R'_S$, and the drain electrode of complementary transistor $Q_2$ is connected to the second power supply terminal $T_2$ through a second drain resistor $R'_D$. A feedback resistor $R'_B$ is connected between the second terminal $T_2$ and the source electrode of transistor $Q_2$. The gate electrode of transistor $Q_2$ is directly coupled to the drain electrode of transistor $Q_1$.

The drain current of the succeeding transistor $Q_2$ is not subjected to variation in the supply voltage due to the presence of resistor $R'_B$. Accordingly, direct-coupled transistors $Q_1$ and $Q_2$ enable an input signal applied to the input terminal $T_3$ to be sufficiently amplified without being affected by variation in the supply voltage.

Figure 4:
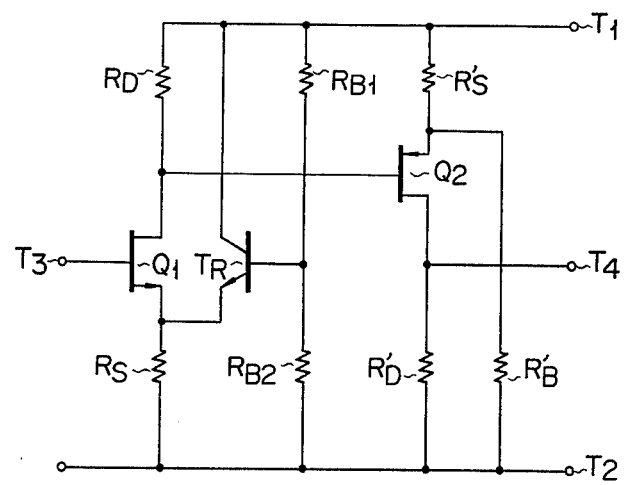
FIG. 4 is a schematic circuit diagram of a direct-coupled signal amplifier circuit according to a fourth embodiment of the invention.

FIG. 4 indicates a direct-coupled signal amplifier circuit according to a fourth embodiment of this invention in which a first and second stages are respectively of the same type as those of FIGS. 2 and 1. The direct-coupled signal amplifier circuit according to this embodiment can provide a larger gain than that of FIG. 3.

Figure 5:
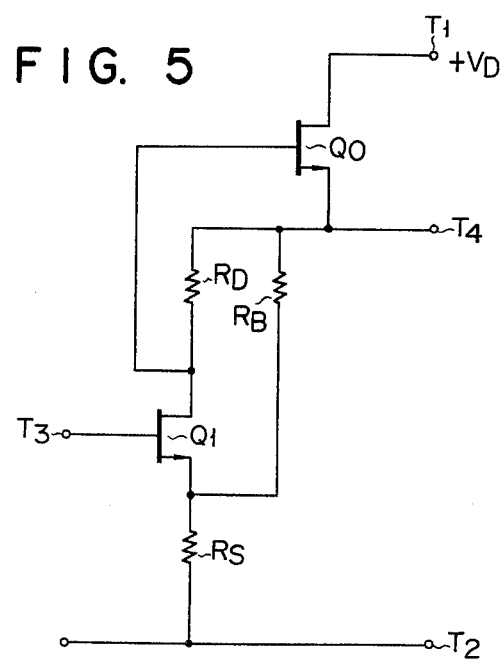
FIG. 5 is a schematic circuit diagram of a direct-coupled signal amplifier circuit according to a fifth embodiment of the invention.

FIG. 5 illustrates a direct-coupled signal amplifier circuit according to a fifth embodiment of this invention. In this embodiment, two signal amplifiers are connected in series across the power source. A first stage has the same configuration as that of FIG. 1 and is connected between the output terminal $T_4$ and the second power supply terminal $T_2$. A second stage includes an n-channel current unsaturated type field effect transistor $Q_0$ having the same channel type as the field effect transistor $Q_1$. The gate electrode of the second transistor $Q_0$ is connected to the drain electrode of first transistor $Q_1$. The drain and source electrodes of transistor $Q_0$ are connected to the first supply terminal $T_1$ and the output terminal $T_4$, respectively. In this embodiment, an output signal appears between the terminals $T_4$ and $T_2$ and may be coupled to a succeeding stage amplifier as in the other embodiments. Output voltage from the transistor $Q_0$ is applied to the transistor $Q_1$ as power supply voltage. However, the transistor $Q_1$ whose drain current solely depends, as previously described, on an input signal supplied to its gate electrode does not indicate an unstable operation. Obviously, in the fifth embodiment of FIG. 5, the resistor $R_B$ may be replaced by the bipolar transistor of FIG. 2.

What is claimed is:
1. A signal amplifier comprising:
first and second different potential points;
a field effect transistor having gate, drain and source electrodes and displaying current unsaturated triode vacuum tube characteristics;
a bipolar transistor having collector, emitter and base electrodes, the collector and emitter electrodes of said transistor being coupled to said first potential point and said source electrode of said field effect transistor, respectively;
first resistive impedance means coupled between said first potential point and said drain electrode of said field effect transistor;
second resistive impedance means coupled between said second potential point and said source electrode of said field effect transistor;
third resistive impedance means coupled between said first potential point and said base electrode of said bipolar transistor; and
fourth resistive impedance means coupled between said second potential point and said base electrode of said bipolar transistor,
said third resistive impedance means having a resistive value which substantailly equals that of said fourth resistive impedance means multiplied by the voltage amplification factor of said field effect transistor.

2. A signal amplifier circuit comprising:
input and output terminals;
first and second power supply terminals;
a first field effect transistor having gate, drain and source electrodes and displaying current unsaturated triode vacuum tube characteristics, said gate electrode of said first field effect transistor being coupled to said input terminal;
a second field effect transistor having gate, drain and source electrodes and displaying current unsaturated triode vacuum tube characteristics, and said gate electrode of said second transistor being coupled to said drain electrode of said first transistor, said drain electrode of said second transistor being coupled to said first power supply terminal, and said source electrode of said second transistor being coupled to said output terminal;
first resistive impedance means coupled between said drain electrode of said first transistor and said output terminal;
second resistive impedance means coupled between said source electrode of said first transistor and said second power supply terminal; and
third resistive impedance means coupled between said source electrode of said first transistor and said output terminal and having a resistance value which substantially equals that of said second resistive impedance means multiplied by the voltage amplification factor of said first transistor.

* * * * *